(12) United States Patent
Nakamura et al.

(10) Patent No.: US 7,372,143 B2
(45) Date of Patent: May 13, 2008

(54) PRINTED CIRCUIT BOARD INCLUDING VIA CONTRIBUTING TO SUPERIOR CHARACTERISTIC IMPEDANCE

(75) Inventors: Naoki Nakamura, Kawasaki (JP); Midori Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 248 days.

(21) Appl. No.: 11/151,198

(22) Filed: Jun. 14, 2005

(65) Prior Publication Data

US 2005/0230813 A1 Oct. 20, 2005

Related U.S. Application Data

(63) Continuation of application No. PCT/JP03/07262, filed on Jun. 9, 2003.

(51) Int. Cl.
*H01L 23/04* (2006.01)
*H05K 1/11* (2006.01)
*H05K 7/00* (2006.01)

(52) U.S. Cl. ............... 257/698; 257/701; 257/759; 257/774; 257/786; 174/262; 361/777; 361/803

(58) Field of Classification Search ............... None
See application file for complete search history.

(56) References Cited

U.S. PATENT DOCUMENTS 5,736,679 A 4/1998 Kresge et al.
7,091,424 B2 * 8/2006 Oggioni et al. ............ 174/262

FOREIGN PATENT DOCUMENTS

| JP | 01-168093 | 7/1989 |
|---|---|---|
| JP | 5-206678 | 8/1993 |
| JP | 06-037412 | 2/1994 |
| JP | 7-240584 | 9/1995 |
| JP | 11-112156 | 4/1999 |
| JP | 2000-216513 | 8/2000 |
| JP | 2000-261150 | 9/2000 |
| JP | 2001-223449 | 8/2001 |
| JP | 2001-284802 | 10/2001 |

OTHER PUBLICATIONS

Japanese Office Action, mailed on Sep. 26, 2006, in a corresponding Japanese Patent Application.

* cited by examiner

*Primary Examiner*—Alonzo Chambliss
(74) *Attorney, Agent, or Firm*—Staas & Halsey LLP

(57) ABSTRACT

A via is formed in a printed circuit board to penetrate through an insulating layer. A guard pattern, made of an electrically-conductive material, extends on the front surface of the insulating layer along a circle concentric with the via. An electrically-conductive body extends from the guard pattern in the insulating layer along an imaginary cylinder concentric with the via. The guard pattern of the printed circuit board serves to control the characteristic impedance of the via at the front surface of the insulating layer. The electrically-conductive body contributes to a better control of the characteristic impedance of the via. The via is allowed to reliably enjoy a better impedance matching than ever. Noise can sufficiently be suppressed in electric signals running through the via.

20 Claims, 5 Drawing Sheets

PRINTED CIRCUIT BOARD INCLUDING VIA CONTRIBUTING TO SUPERIOR CHARACTERISTIC IMPEDANCE

This application is a continuing application, filed under 35 U.S.C. §111(a), of International Application PCT/JP03/07262, filed Jun. 9, 2003, incorporated by reference herein.

BACKGROUND OF THE INVENTION

1. Field of the Invention

The present invention relates to a printed circuit board unit comprising a so-called printed circuit board and an electronic component mounted on the printed circuit board. In particular, the invention relates to a printed circuit board including a via penetrating through an insulating layer.

2. Description of the Prior Art

For example, a printed circuit board sometimes comprises a via penetrating through an insulating layer, as disclosed in Japanese Patent Application Publication No. 2000-261150. The printed circuit board includes a core layer made of an insulating material for supporting a ground layer over the front surface. A power supply layer is formed along the back surface of the core layer. Insulating layers are overlaid on the front and back surfaces of the core layer. Signal line patterns are allowed to extend on the exposed surfaces of the individual insulating layers. Vias are utilized to connect the signal rine patterns to each other. The vias penetrate through the core layer, the insulating layers, the ground layer and the power supply layer.

A columnar ground wall concentric with the via is embedded within the core layer. The ground wall is connected to the ground layer. The impedance matching is in this manner intended for the characteristic impedance. However, the ground wall completely fails to penetrate into any of the insulating layers. The characteristic impedance cannot sufficiently be controlled for the via.

SUMMARY OF THE INVENTION

It is accordingly an object of the present invention to provide a printed circuit board contributing to a better control of the characteristic impedance of a via.

According to the present invention, there is provided a printed circuit board comprising: a via penetrating through an insulating layer; a guard pattern made of an electrically-conductive material, said guard pattern extending on the front surface of the insulating layer along a circle concentric with the via; and an electrically-conductive body extending form the guard pattern, said electrically-conductive body located in the insulating layer along an imaginary cylinder concentric with the via.

The guard pattern of the printed circuit board serves to control the characteristic impedance of the via at the front surface of the insulating layer. The electrically-conductive body continuous from the guard pattern serves to surround the via in the insulating layer. The electrically-conductive body thus contributes to a better control of the characteristic impedance of the via. The via is allowed to reliably enjoy a better impedance matching than ever. Noise can sufficiently be suppressed in electric signals running through the via. In general, no electrically-conductive material is located within the insulating layer of the type around the via. In this case, the characteristic impedance cannot sufficiently be controlled for the via in the insulating layer.

The printed circuit board may further comprise a ground pattern made of an electrically-conductive material. The ground pattern may be formed to extend along the back surface of the insulating layer. The ground pattern preferably receives the tip end of the electrically-conductive body extending from the guard pattern. When the electrically-conductive body is in this manner connected to the ground pattern, the guard pattern can be connected to the ground pattern. Electric current in the guard pattern can easily be led to the ground pattern. The path for the electric current can be facilitated in the overall printed circuit board. The facilitated path for the electric current contributes to a further reduction in noise of electric signals.

The printed circuit board may further comprise a ground wall extending from the ground pattern along a column concentric with extending from the ground pattern along a column concentric also the ground wall serves to surround the via in the printed circuit board. The characteristic impedance of the via can thus be controlled in a more efficient manner.

The electrically-conductive body may comprise a via, for example. Alternatively, the electrically-conductive body may comprise an electrically-conductive wall extending along the aforementioned imaginary cylinder. The inner space of the via may remain void or be filled with an electrically-conductive material.

An electronic component may be mounted on the surface of the aforementioned printed circuit board, for example. In this case, the printed circuit board of the type may include a signal line pattern made of an electrically-conductive material, said signal line pattern extending on the surface of an insulating layer so as to establish an electric connection with the electronic component; a via connected to the signal line pattern, said via penetrating through the insulating layer; a guard pattern made of an electrically-conductive material, said guard pattern extending on the surface of the insulating layer along a circle concentric with the via; and an electrically-conductive body extending from the guard pattern, said electrically-conductive body located in the insulating layer along an imaginary cylinder concentric with the via.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
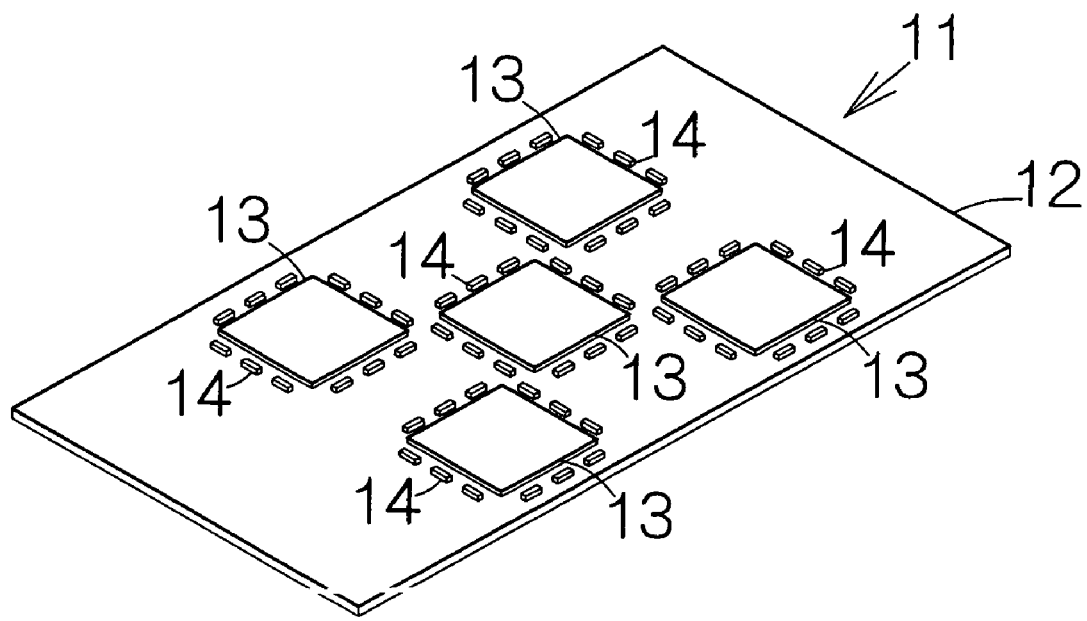
FIG. 1 is a perspective view illustrating an example of a printed circuit board unit.

FIG. 1 illustrates an example of a printed circuit board unit. The printed circuit board unit 11 includes a printed circuit board 12. Electronic components such as central processing units (CPUs) 13, capacitances 14, and the like, are mounted on the front surface of the printed circuit board 12. Electric connections are established between the electronic components through signal line patterns extending on the front and back surfaces of the printed circuit board 12, for example. The signal line patterns may be made of an electrically-conductive material.

Figure 2:
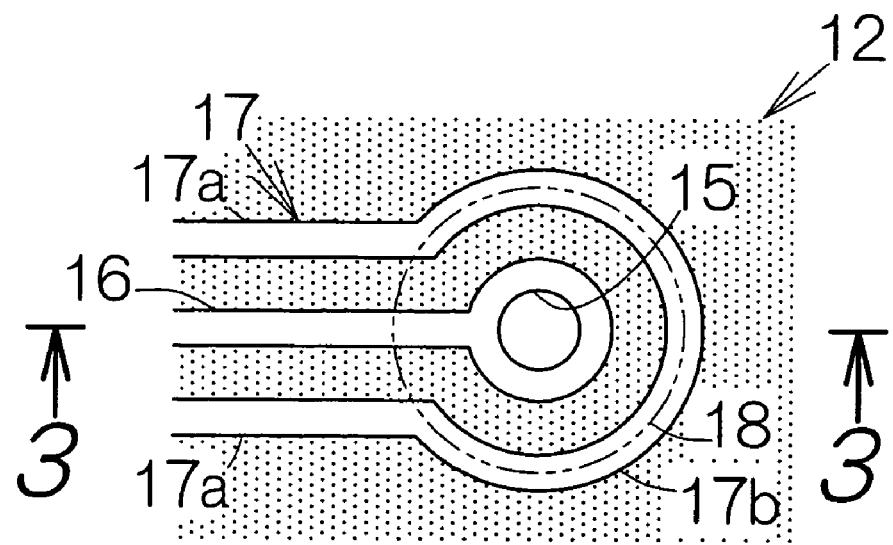
FIG. 2 is an enlarged partial plan view illustrating the front surface of a printed circuit board in the printed circuit board unit.

As shown in FIG. 2, a via or vias 15 is formed in the printed circuit board 12. The via 15 may be made of an electrically-conductive material such as copper, for example. The via 15 penetrates through the printed circuit board 12 from the front surface to the back surface. A signal line pattern or patterns 16 is connected to the via or vias 15 extending on the front and back surfaces of the printed circuit board 12. The inner space of the via 15 may remain void or be filled with an electrically-conductive material.

A ground guard pattern 17, made of an electrically-conductive material, is formed on the front and back surfaces of the printed circuit board 12 around the signal line pattern 16 and the via 15. The ground guard pattern 17 seamlessly surround the signal line pattern 16 and the via 15. Specifically, the ground guard pattern 17 includes a pair of straight pattern 17a extending in parallel with the signal line line pattern 16 located in a space interposed between the straight patterns 17a, 17a, and a circular pattern 17b extending along an imaginary circle 18 concentric with the via 15 so as to connect the tip ends of the straight patterns 17a, 17a to each other. A constant interval is established between the straight patterns 17a, 17a and the signal line pattern 16. Likewise, a constant interval is established between the circular pattern 17b and the via 15.

Figure 3:
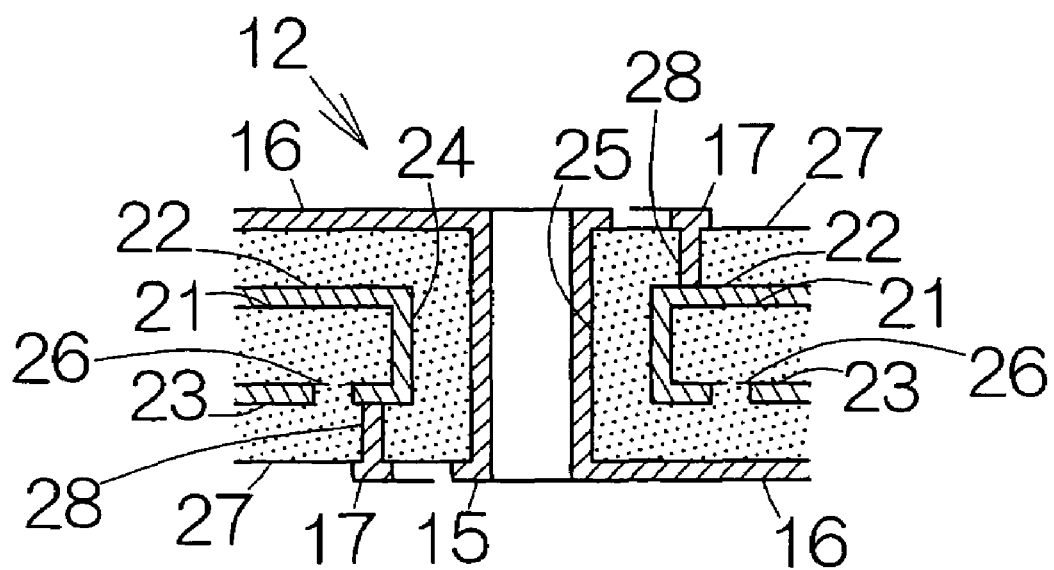
FIG. 3 is a vertical sectional view taken along the line 3-3 in FIG. 2.

As shown in FIG. 3, the printed circuit board 12 includes a core substrate 21 serving as an insulating layer according to the present invention. The core substrate 21 has a rigidity enough to keep its original shape. A ground pattern 22 made of an electrically-conductive material extends on the front surface of the core substrate 21. The ground pattern 22 may be formed to cover over the entire front surface of the core substrate 21. A power supply pattern 23 made of an electrically-conductive material extends on the back surface of the core substrate 21. The power supply pattern 23 may be formed to cover over the entire back surface of the core substrate 21. Electric current for operation is supplied to the electronic components 13, 14 from the power supply pattern 23. The supplied electric current flows into the ground pattern 22 through the electronic components 13, 14. The ground pattern 22 and the power supply pattern 23 may be made of a metallic material such as copper, for example.

A columnar ground wall 24 is incorporated in the core substrate 21. The columnar ground wall 24 is formed concentric with the via 15. An insulating material 25 serves to isolate the ground wall 24 from the via 15. The ground wall 24 may be made of an electrically-conductive material in the same manner as the ground pattern 22. The upper end of the ground wall 24 is connected to the ground pattern 22 at the front surface of the core substrate 21. The lower end of the ground wall 24 reaches the back surface of the core substrate 21. An annular insulating layer 26 serves to isolate the ground wall 24 from the power supply pattern 23 at the back surface of the core substrate 21. The annular insulating layer 26 is located concentric with the via 15.

Insulating layers 27, 27 are respectively overlaid on the front and back surfaces of the core substrate 21. The insulating layer 27 covers over the ground pattern 22 on the front surface of the core substrate 21. The insulating layer 27 like wise covers over the power supply pattern 23 on the back surface of the core substrate 21. The aforementioned signal line patterns 16 and ground guard patterns 17 are formed on the exposed surfaces of the individual insulating layers 27, 27. The via 15 penetrates through the core substrate 21 as well as the insulating layers 27, 27.

Figure 4:
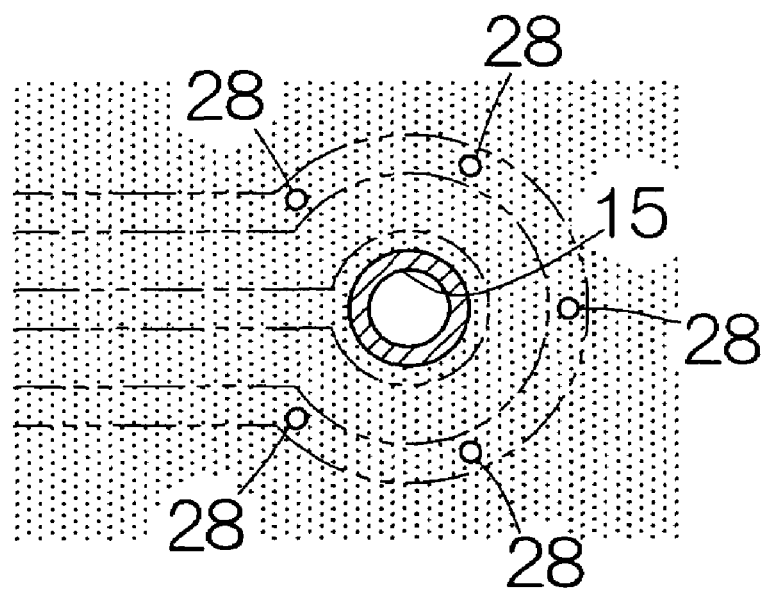
FIG. 4 is an enlarged partial plan view for illustrating the positional relationship between a via and an electrically-conductive body.

Electrically-conductive bodies 28 are embedded in the individual insulating layers 27, 27 along an imaginary cylinder concentric with the via 15. Here, the electrically-conductive body 28 comprises a via terminated at the core substrate 21. The inner space of the via may remain void or be filled with an electrically-conductive material. The outer end of the electrically-conductive body 28 reaches the exposed surface of the insulating layer 27. The electrically-conductive body 28 is connected to the circular pattern 17b of the corresponding ground guard pattern 17 at the exposed surface of the insulating layer 27. The inner end of the electrically-conductive body 28 reaches the inward surfaces of the insulating layers 27, 27, namely the front and back surfaces of the core substrate 21. The electrically-conductive body 28 is received on the ground pattern 22 and the ground wall 24 at the front or back surface of the core substrate 21. The electrically-conductive body 28 serves to establish an electric connection between the ground guard pattern 17 and the ground pattern 22. The electrically-conductive bodies 28 may be arranged around the via 15 at equal intervals as shown in FIG. 4, for example.

The printed circuit board unit 11 allows the ground wall 24 to surround the via 15 in the core substrate 21. The electrically-conductive bodies 28 serve to surround the via 15 in the insulating layers 27, 27. The via 15 can in this manner be surrounded by the ground line over the entire region in the longitudinal direction of the via 15. The characteristic impedance can thus sufficiently be controlled for the vias 15. The vias 15 are allowed to enjoy a better impedance matching than ever. Noise of electric signals can thus be suppressed in the signal line patterns 16. Moreover, the electrically-conductive bodies 28 serve to connect the ground pattern 22 to the ground guard pattern 17, so that electric current can easily be led to the ground pattern 22 from the ground guard pattern 17. The path for the electric current can thus be facilitated in the overall printed circuit board 12. The facilitated path for the electric current contributes to a further reduction in noise of electric signals.

Figure 5:
FIG. 5 is an enlarged partial vertical sectional view schematically illustrating a core substrate in the production of the printed circuit board.

Next, a brief description will be made on a method of making the printed circuit board 12. The core substrate 21 is first prepared. As shown in FIG. 5, a through hole or holes 31 is formed in the core substrate 21, for example. A drill, a laser beam, or the like, may be utilized to bore the through hole 31.

Figure 6:
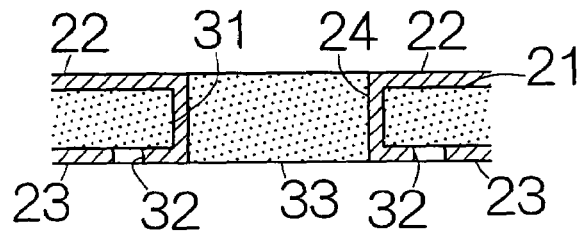
FIG. 6 is an enlarged partial vertical sectional view, corresponding to FIG. 5, for schematically illustrating a ground pattern, a ground wall and a power supply pattern.

The core substrate 21 is then subjected to plating process employing an electrically-conductive material such as copper after the through hole 31 has been formed. The exposed surfaces of the core substrate 21 are thus covered with the copper film. The copper film is then subjected to etching process. A photoresist film is formed on the surface of the copper film prior to the execution of the etching process. An annular void is defined in the photoresist film so as to surround the through hole 31 at the back surface of the core substrate 21. The copper film is removed in the annular void during the etching process. As shown in FIG. 6, the ground pattern 22 is in this manner formed on the front surface of the core substrate 21. The power supply layer 23 is likewise formed on the back surface of the core substrate 21. The ground wall 24 is simultaneously formed along the inside surface of the through hole 31. An annular void 32 is established between the ground wall 24 and the power supply pattern 23 at the back surface of the core substrate 21. The photoresist film may be removed after the etching process has been completed. The inner space inside the ground wall 24 is then filled with an insulating material 33.

Figure 7:
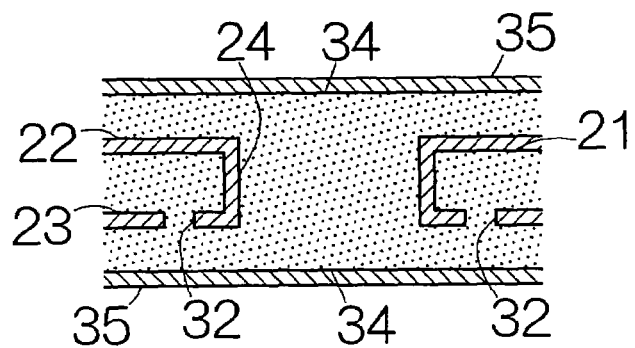
FIG. 7 is an enlarged partial vertical sectional view, corresponding to FIG. 5, for schematically illustrating insulating layers formed on the front and back surfaces of the core substrate.

As shown in FIG. 7, insulating films 34, 34 and copper foils 35, 35 are subsequently overlaid on the front and back surfaces of the core substrate 21 in this sequence. Pressing may be employed to adhere the insulating films 34 and the copper foils 35 onto the core substrate 21, for example. The insulating layers 27, 27 are in this manner formed. The annular void 32 is simultaneously filled up with the insulating film 34 at the back surface of the core substrate 21. The annular insulating layer 26 is in this manner formed.

Figure 8:
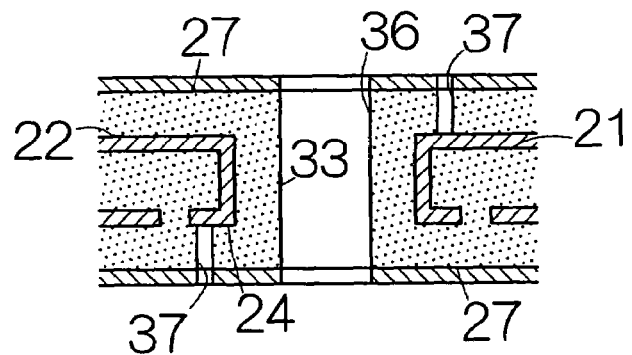
FIG. 8 is an enlarged partial vertical sectional view, corresponding to FIG. 5, for schematically illustrating bottom holes formed in the insulating layers.

As shown in FIG. 8, a through hole 36 is thereafter formed through the insulting layers 27, 27 and the insulating material 33. Bottomed holes 37, 37 are likewise formed in the insulating layers 27, 27. The bottomed holes 37 reach the front or back surface of the core substrate 21. A drill, a laser beam, or the like, may be employed to form the through hole 36 and the bottomed holes 37, for example.

Plating process of an electrically-conductive material is again effected after the through hole 36 and the bottomed holes 37 have been formed. The plating process serves to establish the via 15 in the through hole 36. The bottomed holes 37 are simultaneously filled up with the electrically-conductive material. The electrically-conductive bodies 28 are thus formed. The copper foil is then subjected to etching process. A photoresist film is formed on the exposed surfaces of the copper foils in the etching process. The shape of the photoresist film corresponds to the shapes of the signal line patterns 16 and the ground guard patterns 17. The copper foil is removed at positions off the photoresist film during the etching process. The signal line patterns 16 and the ground guard patterns 17 are thus formed on the exposed surfaces of the insulating layers 27, 27. The photoresist film is removed after the etching process has been completed. The printed circuit board 12 as shown in FIG. 3 can thus be obtained.

Figure 9:
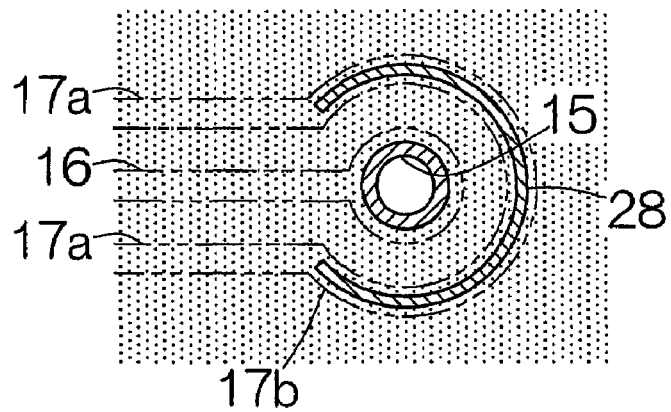
FIG. 9 is an enlarged partial plan view, corresponding to FIG. 4, for illustrating a modification of the electrically-conductive body.
Figure 10:
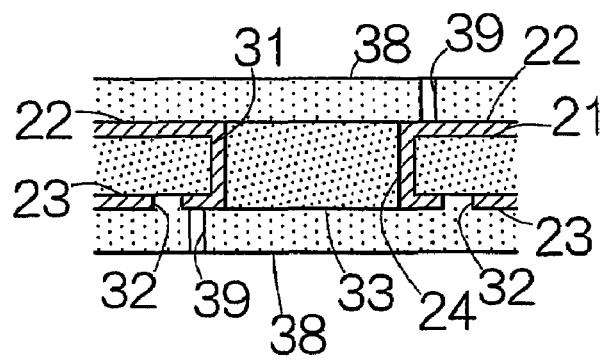
FIG. 10 is an enlarged partial vertical sectional view, corresponding to FIG. 5, for schematically illustrating a method of making the electrically-conductive body according to the modification.
Figure 11:
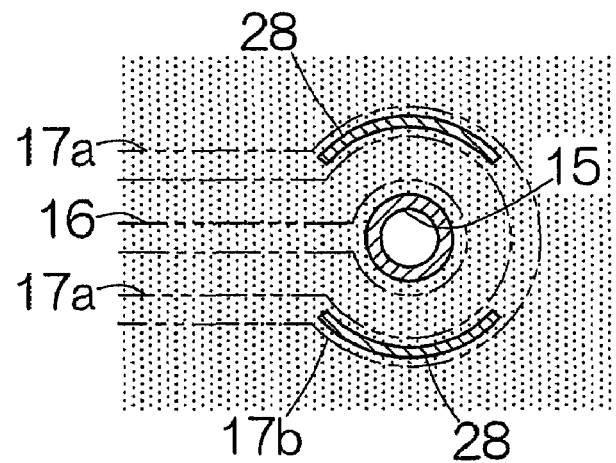
FIG. 11 is an enlarged partial plan view, corresponding to FIG. 4, for illustrating another modification of the electrically-conductive body.

For example, the electrically-conductive body 28 may form an electrically-conductive wall extending along the imaginary cylinder, as shown in FIG. 9. The electrically-conductive wall serves to control the characteristic impedance of the via 15 in a more efficient manner. The electrically-conductive wall may be formed prior to the formation of the insulating layers 27, 27 in the production of the printed circuit board 12 of the type. As shown in FIG. 10, photoresist films 38 may be formed on the front and back surfaces of the core substrate 21 after the space inside the ground wall 24 has been filled with the insulating material 33. Voids 39 are defined in the photoresist films 38. The shape of the void 39 serves to define the contour of the electrically-conductive body 28. Plating, sputtering, or the like, is utilized to form the electrically-conductive body 28 within the void 39. The photoresist films 38 are then removed. The insulating layers 27 are thereafter formed on the front and back surfaces of the core substrate 21. Otherwise, the electrically-conductive body 28 may comprise a pair of electrically-conductive wall piece extending along the aforementioned imaginary cylinder, as shown in FIG. 11, for example.

Figure 12:
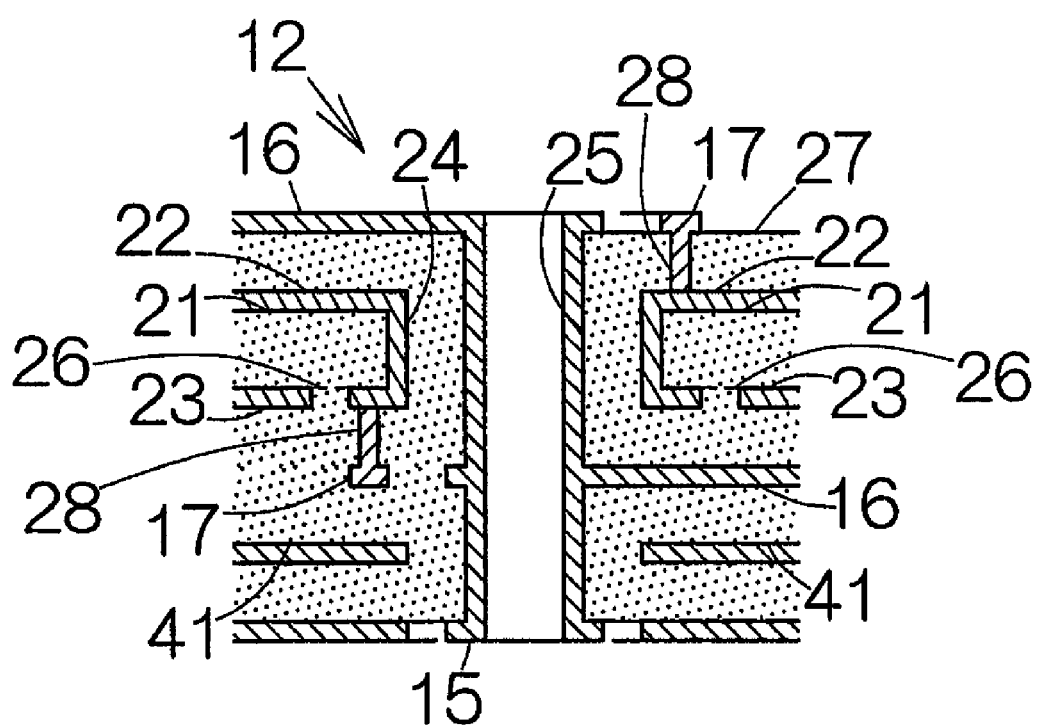
FIG. 12 is an enlarged partial vertical sectional view, corresponding to FIG. 3, for illustrating a modification of the printed circuit board.

As shown in FIG. 12, the printed circuit board 12 may employ the structure of six layers instead of the aforementioned structure of four layers. In this case, the ground guard pattern 17 continuous from the electrically-conductive body 28 may be covered with an insulating layer 41. It should be noted that the structure other than four or six layers may be employed to realize the aforementioned electrically-conductive body 28.

What is claimed is:

1. A printed circuit board comprising:
   first, second and third insulating layers over laid on one another in this sequence;
   a via penetrating through the first, second and third insulating layers;
   a guard pattern made of an electrically-conductive material, said guard pattern extending on a front surface of the first insulating layer along a circle concentric with the via; and
   an electrically-conductive body extending from the guard pattern and penetrating through the first insulating layer along an imaginary cylinder concentric with the via;
   a ground pattern made of an electrically-conductive material, the ground pattern formed on a surface of the second insulating layer, said ground pattern receiving a tip end of the electronically-conductive body; and
   a cylindrical ground wall made of an electrically-conductive material, the cylindrical ground wall extending from the ground pattern along an imaginary cylinder concentric with the via, said cylindrical ground wall penetrating through at least the second insulating layer.

2. The printed circuit board according to claim 1, further comprising a ground pattern made of an electrically-conductive material formed to extend along a back surface of the insulating layer, said ground pattern receiving a tip end of the electrically-conductive body extending from the guard pattern.

3. The printed circuit board according to claim 2, further comprising a ground wall extending from the ground pattern along a column concentric with the via.

4. The printed circuit board according to claim 1, wherein said electrically-conductive body comprises a via.

5. The printed circuit board according to claim 4, further comprising a ground pattern made of an electrically-conductive material formed to extend along a back surface of the insulating layer, said ground pattern receiving a tip end of the electrically-conductive body extending from the guard pattern.

6. The printed circuit board according to claim 5, further comprising a ground wall extending from the ground pattern along a column concentric with the via.

7. The printed circuit board according to claim 1, wherein said electrically-conductive body comprises an electrically-conductive wall extending along the imaginary cylinder.

8. The printed circuit board according to claim 7, further comprising a ground pattern made of an electrically-conductive material formed to extend along a back surface of the insulating layer, said ground pattern receiving a tip end of the electrically-conductive body extending from the guard pattern.

9. The printed circuit board according to claim 8, further comprising a ground wall extending from the ground pattern along a column concentric with the via.

10. The printed circuit board according to claim 1, further comprising:
- a second guard pattern made of an electrically-conductive material, said second guard pattern extending on a back surface of the third insulating layer along a circle concentric with the via; and
- a second electrically-conductive body extending from the second guard pattern, said second electrically-conductive body penetrating through the third insulating layer along an imaginary cylinder concentric with the via, the second electrically-conductive body connected to the cylindrical ground wall at a back surface of the second insulating layer.

11. A printed circuit board unit comprising:
- a printed circuit board;
- an electronic component mounted on a surface of the printed circuit board;
- first, second and third insulatinq layers overlaid on one another in this sequence in the printed circuit board;
- a signal line pattern made of an electrically-conductive material, said signal line pattern extending on a surface of the first insulating layer in the printed circuit board so as to establish an electric connection with the electronic component;
- a via connected to the signal line pattern, said via penetrating through the first, second and third insulating layers;
- a guard pattern made of an electrically-conductive material, said guard pattern extending on a front surface of the first insulating layer along a circle concentric with the via; and
- an electrically-conductive body extending from the guard pattern and penetratinq throuqh the first insulating layer along an imaginary cylinder concentric with the via;
- a ground pattern made of an electrically-conductive material, the ground pattern being formed on a surface of the second insulating layer and receiving a tip end of the electrically-conductive body; and
- a cylindrical ground wall made of an electrically-conductive material, the cylindrical ground wall extending, from the ground pattern along an imaginary cylinder concentric with the via, and penetrating through at least the second insulating layer.

12. The printed circuit board unit according to claim 11, further comprising a ground pattern made of an electrically-conductive material formed to extend along a back surface of the insulating layer, said ground pattern receiving a tip end of the electrically-conductive body extending from the guard pattern.

13. The printed circuit board unit according to claim 12, further comprising a ground wall extending from the ground pattern along a column concentric with the via.

14. The printed circuit board unit according to claim 11, wherein said electrically-conductive body comprises a via.

15. The printed circuit board unit according to claim 14, further comprising a ground pattern made of an electrically-conductive material formed to extend along a back surface of the insulating layer, said ground pattern receiving a tip end of the electrically-conductive body extending from the guard pattern.

16. The printed circuit board unit according to claim 15, further comprising a ground wall extending from the ground pattern along a column concentric with the via.

17. The printed circuit board unit according to claim 11, wherein said electrically-conductive body comprises an electrically-conductive wall extending along the imaginary cylinder.

18. The printed circuit board unit according to claim 17, further comprising a ground pattern made of an electrically-conductive material formed to extend along a back surface of the insulating layer, said ground pattern receiving a tip end of the electrically-conductive body extending from the guard pattern.

19. The printed circuit board unit according to claim 18, further comprising a ground wall extending from the ground pattern along a column concentric with the via.

20. The printed circuit board unit according to claim 11, further comprising:
- a second guard pattern made of an electrically-conductive material, said second guard pattern extending on a back surface of the third insulating layer along a circle concentric with the via; and
- a second electrically-conductive body extending from the second guard pattern, said second electrically-conductive body penetrating through the third insulating layer along an imaginary cylinder concentric with the via, the second electrically-conductive body connected to the cylindrical ground wall at a back surface of the second insulating layer.

* * * * *

UNITED STATES PATENT AND TRADEMARK OFFICE
CERTIFICATE OF CORRECTION

PATENT NO. : 7,372,143 B2 Page 1 of 1
APPLICATION NO. : 11/151198
DATED : May 13, 2008
INVENTOR(S) : Naoki Nakamura et al.

It is certified that error appears in the above-identified patent and that said Letters Patent is hereby corrected as shown below:

Column 7, Line 27, change "insulatinq" to --insulating--.

Column 7, Line 42, change "penetratinq throuqh" to --penetrating through--.

Signed and Sealed this

Thirtieth Day of September, 2008

JON W. DUDAS
*Director of the United States Patent and Trademark Office*